(12) United States Patent
Gibson

(10) Patent No.: US 7,554,400 B2
(45) Date of Patent: Jun. 30, 2009

(54) INTEGRATOR AND ERROR AMPLIFIER

(75) Inventor: Neil Gibson, Freising (DE)

(73) Assignee: Texas Instruments Deutschland GmbH, Dallas, TX (US)

( * ) Notice: Subject to any disclaimer, the term of this patent is extended or adjusted under 35 U.S.C. 154(b) by 47 days.

(21) Appl. No.: 11/782,515

(22) Filed: Jul. 24, 2007

(65) Prior Publication Data
US 2008/0024209 A1 Jan. 31, 2008

Related U.S. Application Data

(60) Provisional application No. 60/882,375, filed on Dec. 28, 2006.

(30) Foreign Application Priority Data

Jul. 25, 2006 (DE) .................. 10 2006 034 349

(51) Int. Cl.
  *H03F 3/45* (2006.01)
  *G06G 7/18* (2006.01)
(52) U.S. Cl. ...................... 330/253; 327/336
(58) Field of Classification Search ............... 330/253; 327/336–345
  See application file for complete search history.

(56) References Cited

U.S. PATENT DOCUMENTS

| 4,360,787 A | * | 11/1982 | Galpin | ................. 330/284 |
| 4,395,681 A | * | 7/1983 | Hornung et al. | ............. 330/259 |
| 6,188,498 B1 | * | 2/2001 | Link et al. | ................. 398/195 |
| 2004/0075462 A1 | * | 4/2004 | Kizer et al. | ................. 326/29 |
| 2006/0044065 A1 | | 3/2006 | Ishida | |

FOREIGN PATENT DOCUMENTS

| DE | 24 48 925 | 4/1976 |
| EP | 05037808 | 2/1993 |
| EP | 1 387 479 | 2/2004 |
| GB | 2 243 222 | 10/1991 |

* cited by examiner

*Primary Examiner*—Robert Pascal
*Assistant Examiner*—Khiem D Nguyen
(74) *Attorney, Agent, or Firm*—John J. Patti; Wade J. Brady, III; Frederick J. Telecky, Jr.

(57) ABSTRACT

An integrator is provided with protection against drift in the value of an integral during power save mode. An N-bit counter (12) is driven by the output of a comparator (11) to provide a digital count representation of the integral. The digital count is fed as an input to a current-steering digital-to-analog converter (14) which provides a current of corresponding analog magnitude to other circuitry, such as to an input stage of an error amplifier. The digital count is maintained during power save mode, preserving the integral value until resumption of normal operation.

7 Claims, 1 Drawing Sheet

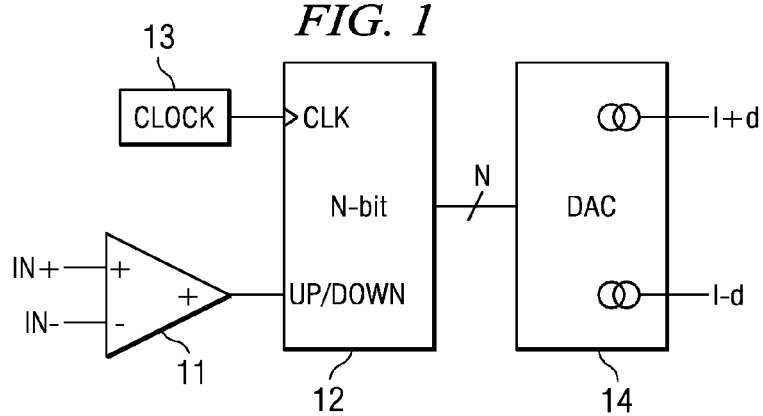
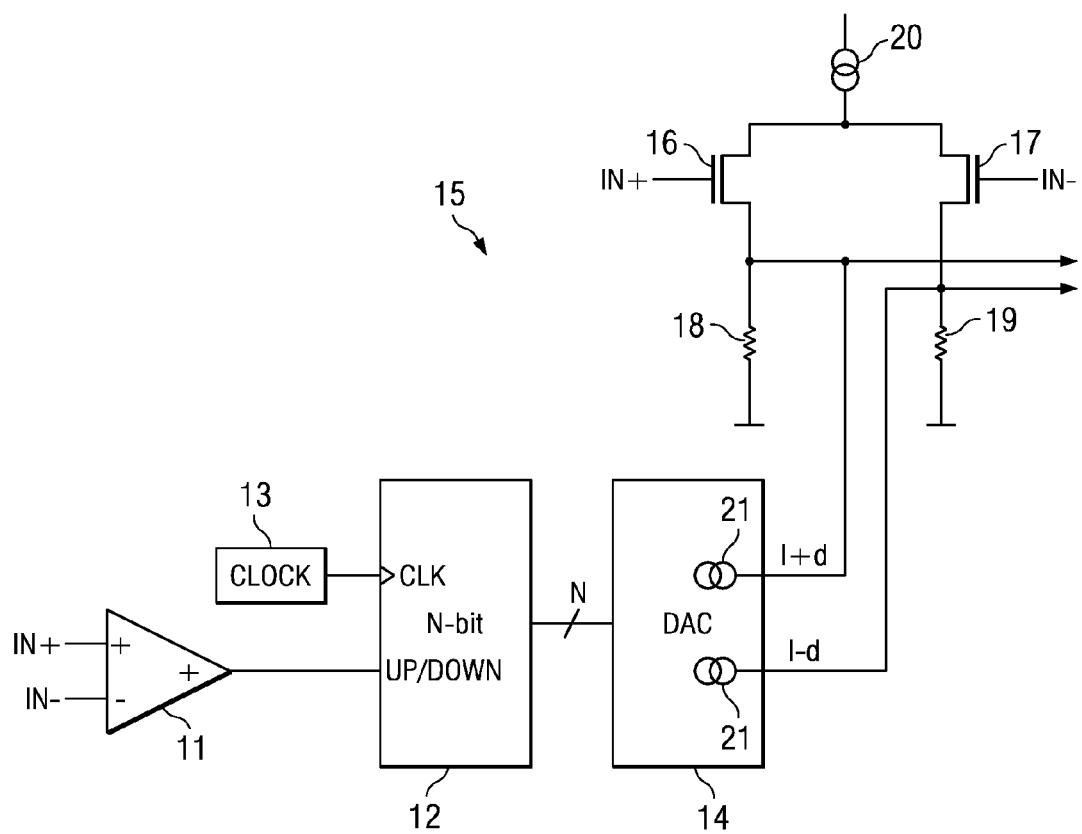

INTEGRATOR AND ERROR AMPLIFIER

This application claims priority under 35 U.S.C. 119 from German Application No. DE 10 2006 034 349.2 filed Jul. 25, 2006, and from U.S. Provisional Application No. 60/882,375 filed Dec. 28, 2006, the entireties of both of which are incorporated herein by reference.

BACKGROUND

The invention relates to an integrator and to an error amplifier incorporating the integrator.

Integrators are fundamental building blocks that are used in a great variety of applications. A conventional integrator basically accumulates electric charge in a capacitor and is therefore analog by nature. Some low power applications have a power save mode in which most of the normal functionality is disabled. Examples are portable telecommunication sets which are usually battery-powered. When normal operation is resumed, the application ideally continues as if it had never stopped. If the application uses an integrator, however, the value of the integral will have drifted with time, and there will be a discontinuity upon resumption of normal operation.

SUMMARY

The invention provides an integrator that can be switched off for an indefinite period of time without any drift in the value of its integral.

In one implementation, the inventive integrator comprises a comparator, an up/down counter, a clock source connected to a count input of the counter, and a current-steering digital-to-analog converter. The output of the comparator is connected to the up/down control input of the counter; the digital output of the counter is connected to the input of the current-steering digital-to-analog converter; and the current output of the current-steering digital-to-analog converter is fed to a circuit node of defined impedance. Due to the use of a digital counter that replicates an integrating function, the current value of the "integral" is not lost when the integrator is switched off. Upon resumption of regular operation, the integrating function is resumed rapidly and accurately.

The inventive integrator is pseudo-analog: although the integrating function is based on a digital counting operation, the output is a quantized analog value. In a preferred embodiment, the current-steering digital-to-analog converter has differential outputs. Thus, the inventive integrator can be referred to as a fully differential pseudo-analog integrator with a quantized output characteristic. In certain kinds of DC-DC converters, an error amplifier is used in association with an integrator to improve the DC accuracy of the output. Thus, in a specific embodiment of the invention, and the integrator is associated with an error amplifier having a differential input stage with a pair of differential outputs. Each of the differential current outputs of the current-steering analog-to-digital converter is connected to one of the differential outputs of the error amplifier's input stage. The use of the inventive integrator in such an application improves the DC accuracy following resumption of regular operation after a power save condition.

The invention also provides an error amplifier that incorporates an integrator and has a differential input stage with a pair of differential outputs. The integrator comprises a comparator, an up/down counter, a clock source connected to a count input of the counter, and a current-steering digital-to-analog converter with differential current outputs. The output of the comparator is connected to the up/down control input of the counter, and the digital output of the counter is connected to the input of the current-steering digital-to-analog converter. Each of the differential current outputs of the current-steering analog-to-digital converter is connected to one of the differential outputs of the error amplifier's input stage. In such an error amplifier, when regular operation is resumed after a power save condition, the error output is not affected by any drift over time of the integrator's value.

BRIEF DESCRIPTION OF THE DRAWINGS

Further advantages and features of the invention will become apparent from the following detailed description with reference to the appended drawings, wherein:

FIG. 1 is a circuit diagram of an integrator according to an embodiment of the invention; and FIG. 2 is a circuit diagram of an integrator and an input stage of an error amplifier according to an embodiment of the invention.

DETAILED DESCRIPTION OF EXAMPLE EMBODIMENTS

An embodiment of the invention is described with reference to FIGS. 1 and 2.

A comparator 11, in the form of an operational amplifier having differential input voltages IN+ and IN−, has its output connected to an up/down control input UP/DOWN of an N-bit up/down counter 12. A clock 13 is connected to the clock input CLK of the N-bit up/down counter 12. The output of the N-bit up/down counter 12 is connected to the input of a digital-to-analog converter (DAC) 14 so that the output of the N-bit up/down counter 12 is fed directly to the DAC 14.

In the illustrated example, although not required, the DAC 14 is a current-steering DAC having current sources 21 and producing two differential outputs 1+d and 1−d. The outputs of DAC 14 do not have to be differential. The outputs 1+d and 1−d are fed to a circuit node of defined impedance. This is shown in FIG. 2, where the outputs 1+d and 1−d are fed to differential outputs of an input stage 15 of an error amplifier. The outputs 1+d and 1−d may also be introduced at another point of defined impedance inside the error amplifier.

The input stage 15 of the depicted error amplifier comprises two MOS transistors 16 and 17. The gate of MOS transistor 16 is provided with a positive input voltage IN+ and the gate of MOS transistor 17 is provided with a negative input voltage IN−. The differential inputs applied to the gates of transistors 16, 17 may be, but do not have to be, the same as the differential inputs provided to the comparator 11. A common current source 20 is connected to the sources of both transistors 16, 17. The output 1+d of DAC 14 is fed to the output of the transistor 16, which is also connected to a load resistor 18. The output 1−d of DAC 14 is fed to the output of the transistor 17 which is also connected to a load resistor 19.

Clock 13 generates a square wave pulse signal, which is fed to the clock input CLK of the N-bit up/down counter 12. Comparator 11 compares the two differential input voltages IN+ and IN− and outputs the difference between the two voltages to the up/down control input UP/DOWN of counter 12. If the difference between the two voltages IN+ and IN− is positive, then the counter 12 counts up incrementally. If the difference between the input voltages IN+ and IN− is negative, the counter 12 counts down.

When the integrator is switched off, counter 12 saves the value N to which the counter 12 has counted up or down to at the point of switching the integrator off. Thus, the current value of the integrator integral is not lost and the value of the integral will not drift over time. The counter then feeds the value N directly to the input of DAC 14, so that DAC 14 has a digital input. DAC 14 then converts the value N into the two differential current outputs 1+d and 1−d at the outputs of DAC 14, and the differential currents 1+d and 1−d are fed to the respective nodes at the drains of the transistors 16, 17, which then form the output stage of the a first input stage of error amplifier 15. The output stage of the first input stage of error amplifier 15 can then be fed to further stages in the error amplifier 15.

The value N is equivalent to the integral in an analog integrator but is in fact quantized and based on a digital counting operation. Thus, the output of DAC 14 is a pseudo-analog output, which, however, behaves in the same way as an analog output from a conventional integrator.

Although the invention has been described herein with reference to a specific embodiment, it is not limited to this embodiment and no doubt other embodiments will occur to the skilled person that lie within the scope of the claimed invention.

What is claimed is:

1. An integrator comprising:
    a comparator that couples a plurality of inputs;
    an up/down counter that couples an output from the comparator;
    a clock source couples to a count input of the counter;
    a current-steering digital-to-analog converter (DAC) that receives, a digital output of the counter wherein the current-steering DAC provides an output; and
    an input stage having a plurality of transistors, wherein the input stage couples the output from the DAC, and wherein each of the plurality of inputs is received by the control electrode of at least one of the plurality of the transistors, and wherein the output stage outputs an integrator output.

2. The integrator of claim 1, wherein the integrator output is fed to a circuit node of defined impedance.

3. The integrator of claim 1, wherein the current-steering digital-to-analog converter has differential current outputs.

4. The integrator of claim 3, associated with an error amplifier which has a differential input stage with a pair of differential outputs, wherein the differential current outputs of the current-steering analog-to-digital converter are respectively connected to the differential outputs of the error amplifier's input stage.

5. An error amplifier incorporating an integrator and having a differential input stage with a pair of differential outputs, the integrator comprising:
    a comparator that receives a positive input and a negative input;
    an up/down counter that is connected to the comparator and that receives an output from the comparator;
    a clock source connected to a count input of the counter;
    an input stage having a plurality of transistors, wherein each of the positive and negative inputs is received by the control electrode of at least one of the plurality of the transistors; and
    a current-steering DAC with differential current outputs, wherein a digital output of the counter is connected to an input of the current-steering DAC, and the differential current outputs of the current-steering DAC are respectively connected to provide current to the differential outputs of the error amplifier's input stage.

6. The error amplifier of claim 5, wherein the input stage comprises:
    two MOS transistors for receiving differential inputs, with the gate of one of the MOS transistors connected to receive a positive input voltage and the gate of the other MOS transistor connected to receive a negative input voltage, and wherein the drains of the MOS transistors are respectively connected to the input stage differential current outputs; and
    a common current source connected to provide current to the sources of the MOS transistors.

7. The error amplifier of claim 6, wherein the drain of each MOS transistor is connected to a load resistor.

* * * * *